United States Patent
Hsieh et al.

(10) Patent No.: US 6,682,802 B2
(45) Date of Patent: Jan. 27, 2004

(54) SELECTIVE PCB STIFFENING WITH PREFERENTIALLY ORIENTED FIBERS

(75) Inventors: George Hsieh, Portland, OR (US); Terrance J. Dishongh, Hillsboro, OR (US); Scott Dixon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/737,213

(22) Filed: Dec. 14, 2000

(65) Prior Publication Data

US 2002/0076522 A1 Jun. 20, 2002

(51) Int. Cl.[7] .................................................. B32B 5/12
(52) U.S. Cl. ........................ 428/113; 428/105; 428/107; 428/109; 428/110; 428/901
(58) Field of Search ................................ 428/113, 105, 428/901, 107, 109, 110; 174/121, 124 R, 110 SR (56) References Cited

U.S. PATENT DOCUMENTS

| | | | |
|---|---|---|---|
| 3,965,942 A | 6/1976 | Hatch | 139/384 R |
| 4,191,800 A | 3/1980 | Holtzman | 428/251 |
| 4,313,995 A | 2/1982 | Delgadillo | 428/201 |
| 4,452,657 A | 6/1984 | Hamm | 156/198 |
| 4,550,051 A | 10/1985 | Spielau et al. | 428/285 |
| 4,563,385 A | 1/1986 | Bhatt et al. | 428/251 |
| 4,800,461 A | 1/1989 | Dixon et al. | 361/398 |
| 4,814,945 A | 3/1989 | Leibowitz | 361/414 |
| 4,851,613 A | 7/1989 | Jacques | 174/68.5 |
| 4,875,282 A | 10/1989 | Leibowitz | 29/830 |
| 4,937,132 A | 6/1990 | Gaku et al. | 428/209 |
| 4,979,019 A | 12/1990 | Paquette et al. | 357/80 |
| 4,980,217 A | 12/1990 | Grundfest et al. | 4287/113 |
| 4,988,577 A | 1/1991 | Jamieson | 428/573 |
| 5,004,639 A | 4/1991 | Desai | 428/138 |
| 5,047,279 A | 9/1991 | Nasu et al. | 428/156 |
| 5,085,922 A | 2/1992 | Murasawa | 428/209 |
| 5,121,297 A | 6/1992 | Haas | 361/398 |

(List continued on next page.)

OTHER PUBLICATIONS

*ATX Specification, Version 2.03*, pp. 5–13.

*Primary Examiner*—Harold Pyon
*Assistant Examiner*—Jane J Rhee
(74) *Attorney, Agent, or Firm*—Schwegman, Lundberg, Woessner & Kluth, P.A.

(57) ABSTRACT

Apparatus and methods are presented for reinforcing and stiffening a printed circuit board (PCB) in selected locations by utilizing preferentially oriented fibers. Selected fibers within the polymeric material matrix of the PCB fiber-matrix layer are removed and replaced with a similar quantity of fibers in a preferential orientation. Various combinations of layering of modified fiber-matrix layer material with conventional fiber-matrix layer material are presented to achieve the desired PCB stiffening. Printed circuit boards, under the weight of heavy attached electronic components, may deflect or flex along an axis, defined as the characteristic fold. This flexing is exasperated with manufacturing and handling loading, particularly when mounted in a chassis. Preferentially orientated fibers laid transverse to the characteristic fold reinforces the area to resist flexure within the area surrounding the characteristic fold. Reducing PCB flexure is particularly important in locations of the PCB containing surface mount technology (SMT) components, such as ball grid array electronic components. The lead attachment for BGA components is particularly susceptible to PCB flexure resulting in lead fatigue, fracture and failure. The presented methods and apparatus provide PCB stiffening without the addition of external PCB stiffeners and without effecting the PCB overall thickness, fiber to matrix ratio, uniform properties, or dielectric properties.

12 Claims, 11 Drawing Sheets

U.S. PATENT DOCUMENTS

| | | | |
|---|---|---|---|
| 5,144,742 A | 9/1992 | Lucas et al. | 29/830 |
| 5,198,279 A | 3/1993 | Beinhaur et al. | 428/99 |
| 5,275,877 A | 1/1994 | Isayev | 428/294 |
| 5,336,353 A | 8/1994 | Masik | 156/273.7 |
| 5,346,747 A | 9/1994 | Vancho et al. | 428/209 |
| 5,376,326 A * | 12/1994 | Medney et al. | 264/510 |
| 5,378,545 A | 1/1995 | Akulow | 428/573 |
| 5,476,703 A * | 12/1995 | Wattel et al. | 428/113 |
| 5,499,444 A | 3/1996 | Doane, Jr. et al. | 29/830 |
| 5,557,503 A | 9/1996 | Isaacs et al. | 361/719 |
| 5,874,152 A * | 2/1999 | Middelman | 428/105 |
| 5,965,245 A | 10/1999 | Okano et al. | 428/209 |
| 5,997,983 A | 12/1999 | Caron et al. | 428/105 |
| 6,084,182 A | 7/2000 | Rehlander | 174/250 |
| 6,103,977 A | 8/2000 | Namgung | 174/255 |

* cited by examiner

SELECTIVE PCB STIFFENING WITH PREFERENTIALLY ORIENTED FIBERS

FIELD

The present invention generally relates to printed circuit boards and, more particularly, to stiffening the printed circuit board in selected locations by utilizing preferentially oriented fibers.

BACKGROUND

Printed circuit boards (PCB) are used in the electronic arts as substrates to mount electronic components and to provide electrical interconnections between those components and components external to the PCB. Printed circuit boards are commonly fabricated from substrates consisting of fiber selected plastic lamina. The circuit board lamina may have one or more fiber layers surrounded by a plastic matrix material. A circuit board may have one or more laminae depending on the specific configuration needed for the electrical components. Each circuit board lamina may have a metalized pattern on one or both sides, such that, when stacked, processed, and assembled with electrical components, the metalized patterns form electrical interconnects between components.

One problem with conventional printed circuit boards is flexing. PCBs flex under the weight of attached electrical components when subject to vibrations, assembly, and handling loads. Ultimately, the PCB with attached electrical components are assembled in a chassis, such as in a computer system. Handling and transit of the chassis assembly can cause PCB flexing under the weight of the components.

Circuit boards, though relatively rigid for their relatively thin profile, tend to flex due to the weight of the circuit components attached and to shock and vibration loads. In order to support the PBC and minimize flexing, support structures attached to the PCB are commonly used. Such attachments include reinforcing bars, beams and rib stiffeners, among others. Such circuit board support or rigidifying structures are undesirable for many reasons. For example, among others, support beams may be attached to the PCB and span the entire width or length of the PCB. Such support beams take up valuable circuit board surface area, which may require offsetting or relocating some of the electrical components. This is undesirable in light of the trend to increase electrical component density on the PCB.

Additionally, electrical components are becoming increasingly heavy. Electrical components that are increasing in weight include, among others, the heatsink and fan assembly which is attached to the central processing unit (CPU). These assemblies are approaching upwards of a pound or more in weight, putting an increased burden on the structure of the PCB.

In an effort to increase electrical component density on the PCB, electrical components may be attached to the PCB using surface mount technology (SMT), such as with ball grid array (BGA) technology. A ball grid array microprocessor, for example, makes its electrical connection via a solder ball on each connector of the BGA of the electrical microprocessor and the electrical contacts on the surface of the PCB. BGA components require a rigid substrate to which they are attached. In effect, BGA components are soldered directly to the circuit board without intervening contacts or wires. BGA components commonly incorporate tens or hundreds of solder connections between the ball-grid package and the circuit board. Any appreciable circuit board flexing may cause the solder connections to shear, compress, fatigue, and subsequently break.

There is a significant need in the art to provide a PCB which is sufficiently rigid in order to support relatively heavy electrical components as well as to provide a rigid structure required for surface mount components, such as ball grid array packages.

DETAILED DESCRIPTION OF THE DRAWINGS

Introduction

In the following detailed description of the drawings, reference is made to the accompanying drawings, which are not necessarily to scale, which form a part hereof, and in which is shown by way of illustration specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

The following figures refer to the computer industry standard ATX form factor motherboard printed circuit board (PCB) to illustrate embodiments of the invention. The scope of the invention is not to be limited to the ATX form factor motherboard or to computer circuit boards in general. The scope of the invention covers any configuration of an electronics board with attached electrical components.

Figure 1:
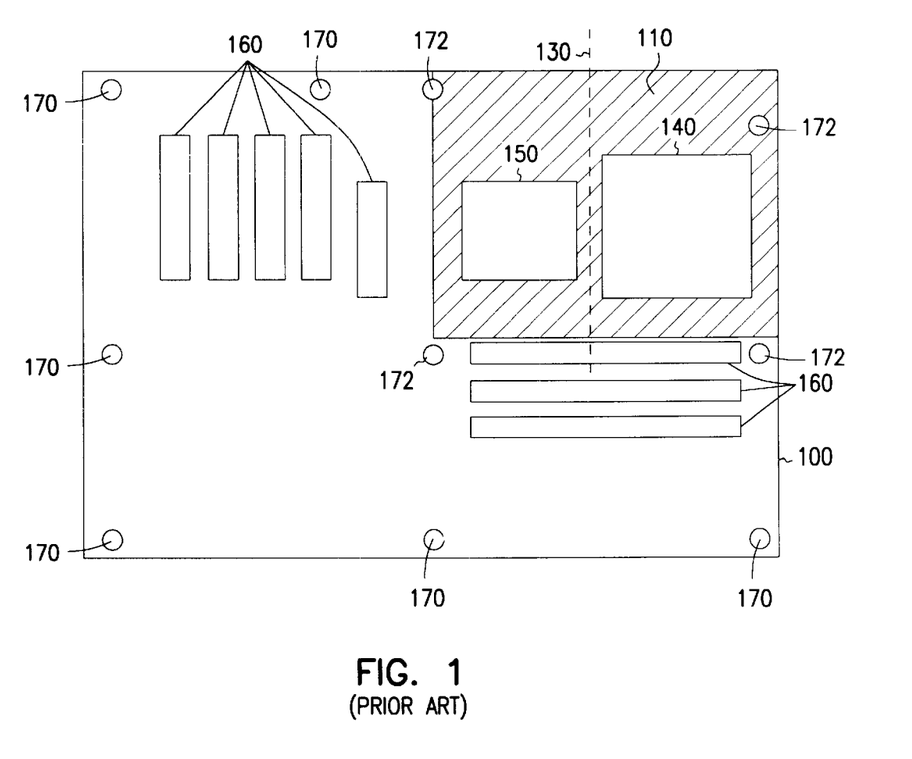
FIGS. 1–4 are, respectively, a top view of a printed circuit board populated with electrical components, a perspective exploded view of the printed circuit board of FIG. 1 showing a plurality of lamina, a perspective exploded view of a lamina of FIG. 2 showing a plurality of fiber-matrix layers, and a side view of the printed circuit board of FIG. 1 showing the deflection of the printed circuit board at a characteristic fold in the core area, according to the prior art.

Referring now to the drawings, FIG. 1 is a top view of printed circuit board 100 populated with electrical components 140, 150, 160. Specifically, printed circuit board 100 may be populated with miscellaneous electronic components 160, as well as a HUB chip set 150 and central processing unit assembly (CPUA) 140. The PCB 100 contains mounting holes 170 into which fasteners are used to secure the PCB 100 to a chassis (not shown) such as a computer enclosure. The PCB 100 shown in FIG. 1 is a representation of the ATX form factor motherboard PCB, an industry standardized PCB configuration for use in personal computers (PCs). PCB 100 can also be referred to as a system board or mainboard. Of particular importance is the standardization of the layout of mounting holes 170 and the relationship between the HUB chip set 150 and CPUA 140 to the miscellaneous components 160. This relationship remains unchanged no matter the size and weights of the HUB chip set 150 and CPUA 140, per the definition of the ATX form factor motherboard specifications.

Miscellaneous electronic components 160 may, for example, include dual inline memory module (DIMM) sockets, accelerated graphics port (AGP) sockets, peripheral component interconnect (PCI) sockets, and assorted resistors, capacitors, circuit chips, and other components. The CPUA 140 is a central processing unit (CPU) in combination with a heat sink and fan. The CPU, may be, for example, one of the CPUs from the Pentium®, Pentium® II, and Pentium® III line of processors available from Intel Corp. of Santa Clara, Calif. HUB chipset 150 contains one or more microprocessors and electrical components that interpret signals from the CPU 140 to control, among other things, the miscellaneous electrical components 160.

The electrical components 140, 150, 160 may be affixed to PCB 100 in a number of different ways, two of which include thru-hole and surface mounting. Thru-hole mounting is a circuit board packaging technique in which the leads or pins on the chips and components are inserted into vias or holes in the PCB 100. The leads are bent 90 degrees under the PCB 100, snipped off and soldered from below the PCB 100. The vias are metalized to form an electrical connection between the electrical component pins and the circuit board. Thru-hole connections are relatively strong and can withstand considerable PCB vibration and loading and subsequent flexing of the PCB. Packaging density of thru-hole components is limited due to the size and number of vias, as well as the spaces between them, needed to make the connections.

Surface mounting refers to the methods used for connecting surface mounted devices (SMD) incorporating surface mounting technology (SMT) to a PCB. Surface mounting is a circuit board packaging technique in which the leads on the electrical components 140, 150, 160 are soldered on top of the PCB 100, not from below it. SMT lends itself to higher component density and therefore PCB's can be smaller and built faster using this method. SMT may be used for electrical components that require a relatively high density of electrical connections, such as those found in the CPUA 140, but more commonly in the HUB chip set 150.

A common SMT used for circuit chips, such as those comprising the HUB chip 150 set, for example, is the ball grid array (BGA). BGA uses a coplanar grid of solder balls as electrical connectors, rather than the long leads used in thru-hole mounting of components. BGA is noted for its compact size, high lead count and low inductance, which allows lower voltages to be used. Because the leads are underneath the chip, BGA has led the way to chip scale packaging (CSP) where the package, such as a microprocessor package, is not more than 1.2× the size of the semiconductor itself. Packaging density of surface mount components may be significantly higher compared with thru-hole components, as vias and their corresponding spaces between them are not required.

The solder balls of a BGA can be made to connect to the printed circuit board using various contact methods. One simple and direct method is to align the solder balls with the corresponding lead pads on the PCB and to melt the solder to effect the connection. With this method, the PCB must be substantially flat in order for all the solder balls to make contact with the corresponding lead pads on the PCB. In addition, the PCB must be substantially rigid such that vibrations and handling loading does not flex the PCB causing the solder connectors to shear and break. In effect, BGA components are soldered directly to the circuit board without intervening contacts or wires. BGA components commonly incorporate tens or hundreds of solder connections between the ball-grid package and the circuit board. Any appreciable circuit board flexing may cause the solder connections to shear, compress, fatigue, and subsequently break.

Figure 2:
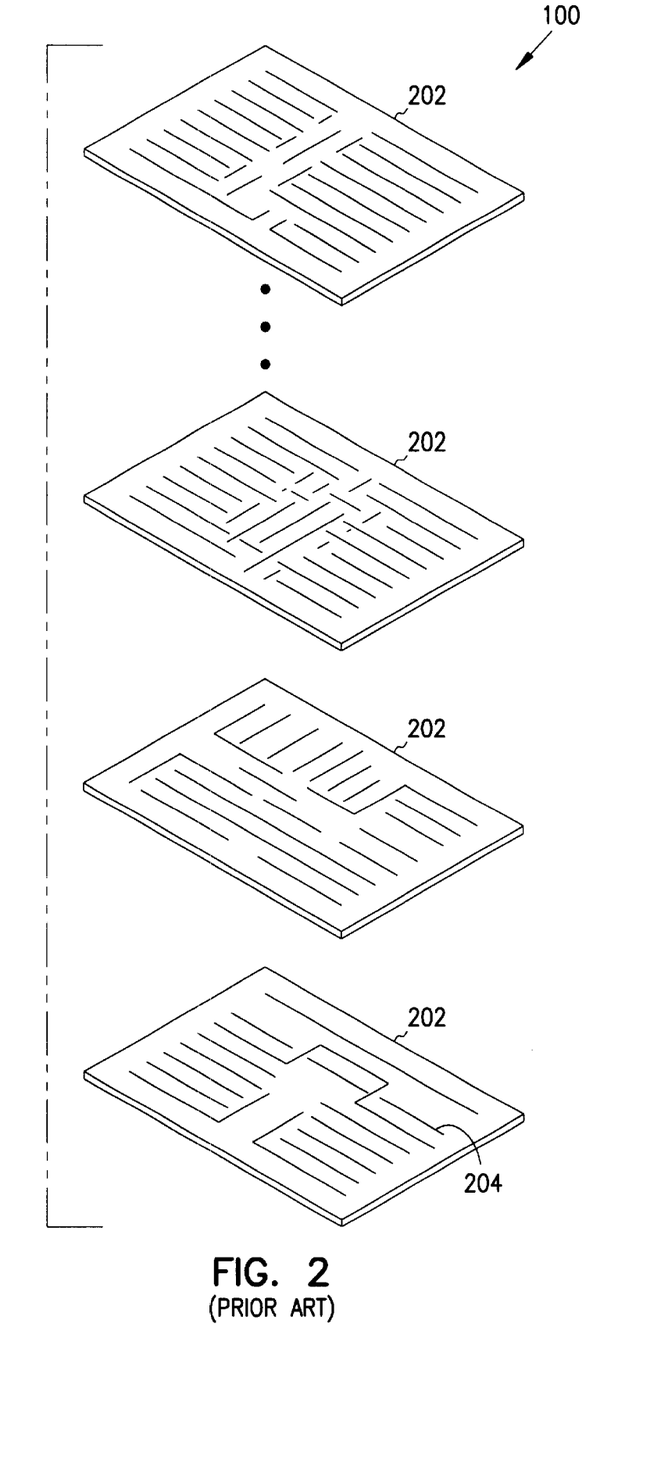

FIG. 2 is a perspective exploded view of the printed circuit board 100 of FIG. 1 showing a plurality of lamina. The PCB 100 is made of one or more lamina 202, typically two to ten in number, that interconnect components via electrical pathways 204. The laminae 202 are stacked together and glued or cured to form the completed PCB 100.

The laminae 202 may contain electrical pathways 204, known in the art as a printed circuit. The "printed" circuit may be an etched circuit. For example, electrically conductive foil, such as copper foil, is placed over one or both sides of the lamina 202 and covered with a photoresist. Light is shined through a negative image of the circuit paths onto the photoresist, hardening the locations that will remain after etching. When passed through an acid bath, the unhardened locations are washed away leaving the conductive copper pathways. The finished laminae 202 are then glued together. If a conductive copper pathway of one lamina 202 is to be in electrical communication with another lamina 202, the electrical connection may be made using a conductive pathway known as a via. The via is created by providing a hole, such as by drilling or punching, through the PCB at the appropriate place where two or more conductive copper pathways are in alignment. The conductive copper pathways are thereby exposed by the hole. Copper is typically used to either fill the hole or coat the sides of the hole, effecting an electrical interconnect between the conductive copper pathways.

Figure 3:
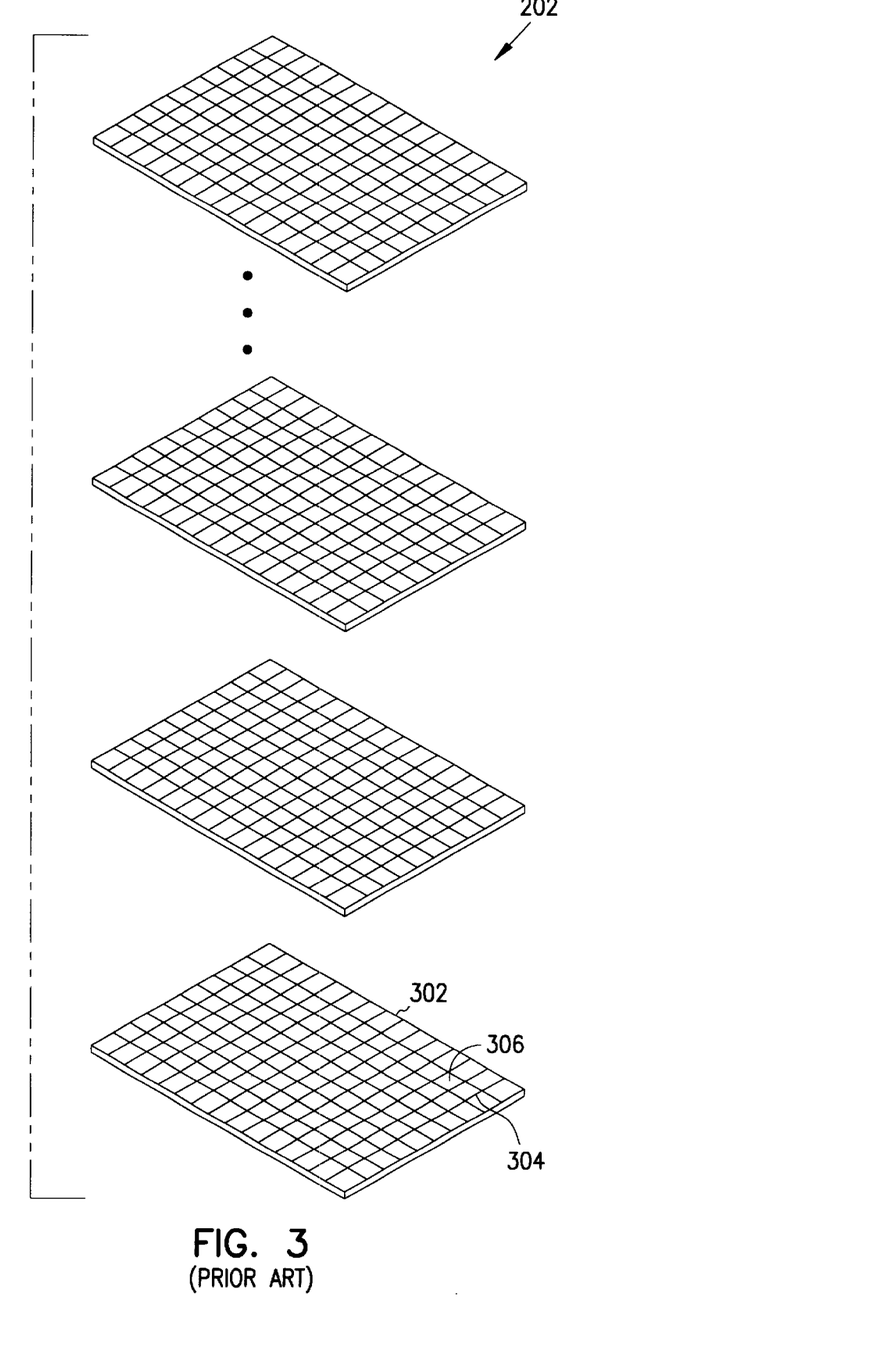

FIG. 3 is a perspective exploded view of a lamina 202 of FIG. 2 showing a plurality of fiber-matrix layers 302. The lamina 202 may consist of one or more fiber-matrix layers 302. The fiber-matrix layers 302 consist of one or more layers of fiber 304 impregnated with a high-temperature polymeric material 306, known as a matrix. The layers of fiber 304 may consist of glass fibers, for example, among other materials. The high-temperature polymeric material 306 may consist of Ultem™ (General Electric Company), for example, among other materials.

Fiber-matrix layers 302 are commonly provided in sheet form. The fiber-matrix layers 302 are subsequently layered to a desired thickness and cured, typically under heat and pressure, to form a lamina 202, a composite substrate that is relatively thin and rigid.

The layers of fiber 304 within the fiber-matrix 302 may consist of fibers 304 formed into an orthogonally-woven cloth, a non-woven mat, or fibers of random orientation, among other configurations. The fibers 304 may be glass or other typically non-conductive fiber materials, although electrically conductive fibers may be advantageously used, such as to provide electromagnetic shielding. The fiber 304 provides structural reinforcement for the high-temperature polymeric material 306. The composition of the fiber 304, therefore, is a significant factor to the overall structural properties of the resulting lamina 202. Fiber 304 orientation, density, and physical characteristics are also significant structural factors. For example, a lamina 202 consisting of fiber-matrix layers 302 consisting of chopped fiber 304 strands will have a different structural property as one consisting of continuous fibers 304 which span the width and length of the fiber-matrix layers 302.

The composition of the fiber 304 and the high-temperature polymeric material 306 will also determine the dielectric properties of the PCB. The PCB dielectric property, such as permittivity, is important, as that determines the electrical interference properties between the individual electrical pathways within the PCB. The greater the electrical conduction of the fibers 304, the greater the dielectric property of the lamina 202, and a corresponding higher potential for electrical interference between neighboring conductive pathways.

The density of fiber 304 within the fiber-matrix layers 302, and therefore, within the resulting lamina 202 of current PCBs is substantially consistent from lamina to lamina and from one part of the lamina to another. In other words, the PCB has a substantially uniform structural property across the finished PCB. That is, the fiber 304 composition, orientation, density, and physical characteristics, among other properties, in any given location on the PCB is the same as another location.

Referring again to FIG. 1, the area of the PCB 100 which contains the HUB chip set 150 and the CPUA 140 is referred to as the core 110. The core 110 is an area of relatively high electrical pathway density that is required by the CPU and HUB chip set 150 components. Generally, it is within the core 110 that can be found SMT components. Approximately at each of the four corners of the core 110 is a mounting hole 172 for accepting a fastener such that the PCB 100 may be fasted to a chassis (not shown). As stated previously, the CPUA 140 contains a heat sink and a fan that adds considerable weight to the CPUA 140. In some instances, the weight of CPUA 140 can be a pound or more. The weight of the CPUA 140 in combination with the flexibility of current art PCB 100 and mounting holds 172, causes PCB 100 to flex at the core 110, among other locations. The maximum deflection is typically found in the area of the PCB farthest away from the mounting fasteners, but is dependent on the specific size and weight of the attached components. This flexure is considerably exacerbated by vibrational or impact loading of the assembled chassis in which PCB 100 is mounted.

High-speed photography of an assembled chassis containing a PCB 100 under dynamic loading conditions reveals that the PCB 100 predominately deflects or flexes at one or more specific locations on the PCB 100. Of particular concern is the flexing occurring in the core 100 since SMT components may be found there or it may be desirable to have SMT components there.

A specific type of PCB 100 flexing occurs at what is referred to as a characteristic fold 130. A characteristic fold 130 is a location on the PCB 100 as if the PCB 100 was being folded in half along the characteristic fold 130. A characteristic fold 130 is the location of maximum deflection under load away from the unloaded state.

The locations of deflections and characteristic folds 130 are dependent on the specific electrical components attached to the PCB 100, as well as the type of loading involved. For a given PCB 100 form factor, such as with the standardized ATX form factor motherboard shown in FIG. 1, one characteristic fold 130 is found to lie between the CPUA 140 and the HUB chip set 150. Circuit board flexure may cause failure of the electrical connections between a surface mounted component and the PCB, as well as cause potential failure of the conductive pathways and the PCB itself.

Figure 4:
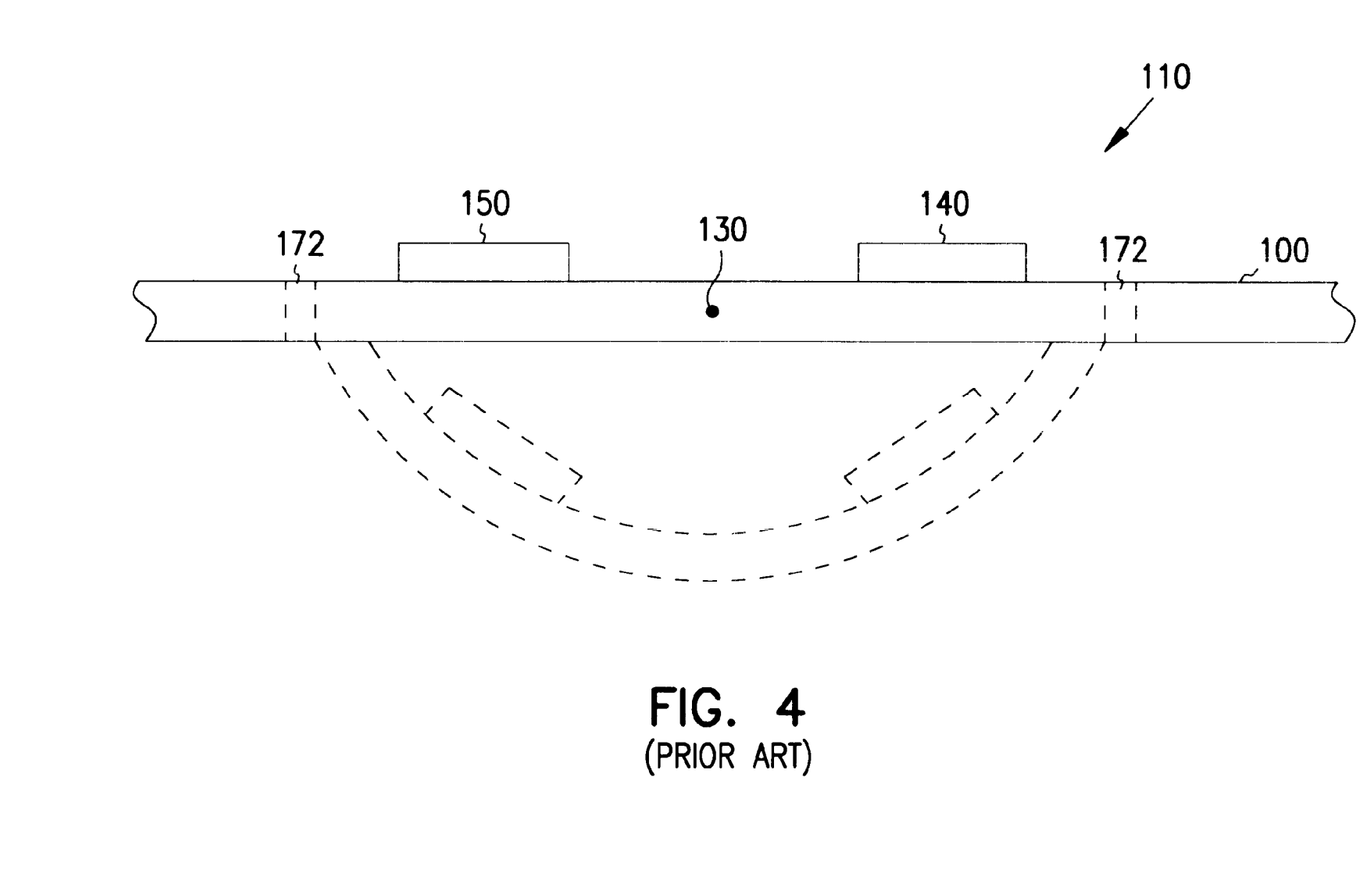

FIG. 4 is a side view of a printed circuit board of FIG. 1 showing the deflection of the PCB 100 at a characteristic fold 130 in the core 110. Under loading conditions, in combination with the relatively heavy CPUA 140 and the arrangement of mounting holes 172, maximum deflection of the PCB 100 away from the unloaded state is found along a dominant axis, the characteristic fold 130. The deflection of the PCB 100 causes the PCB to flex producing a shear and compressive loading, among others, on the electrical connectors of the attached components 140, 150. The SMT components of the HUB chip set 150 are particularly vulnerable to contact breakage due to PCB 100 flexing.

The Present Invention

In order to avoid the flexure problems of prior art printed circuit boards, the present invention provides for a composite panel, suitable for use as a printed circuit board, having selected flexure properties at selected locations. For example, preferential fiber orientation at selected locations on the PCB is used to minimize the flexure at those locations. Specifically, the configuration of the fiber layers within the lamina or the fiber-matrix layer is such that the bending along the characteristic fold is minimized. This is accomplished by preferentially orientating the fibers such that more fibers are positioned perpendicular to the characteristic fold than parallel to the fold. For example, by improving the structural integrity of the core, flexing can be minimized at the core. Since the SMT components are predominantly located at the core of the PCB, PCB flexing must be minimized at that location.

Adding more fibers in a desired orientation in one or more specific locations would result in a more flex-resistant structure, but may undesirably add to the thickness of the lamina at those locations. More preferably, a portion of the fibers may be replaced at the one or more locations by approximately the same number of fibers orientated in a desired direction. This results in substantially the same fiber density as the original fiber orientation, and does not add significantly to the thickness of the PCB.

The fibers replacing the removed fibers may be of the same composition as the original fibers, or of a different composition. In one embodiment, the replacement fibers are more stiff than the original fibers. In another embodiment, the original fibers are composed of one type of glass and the replacement fibers are composed of another type of glass.

Figure 5:
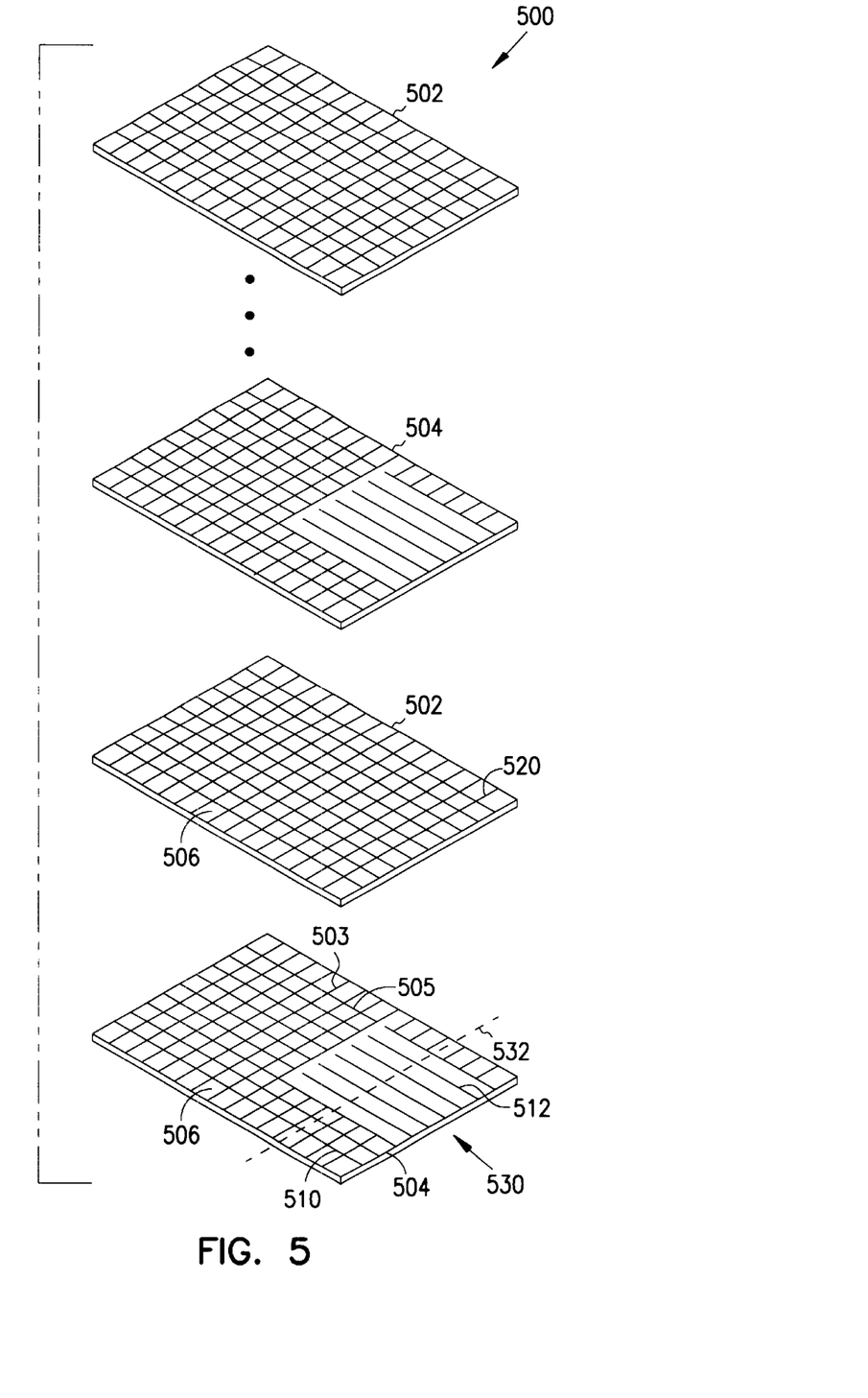
FIG. 5 is a perspective exploded view of a lamina usable as a printed circuit board with selected flexure properties at one selected location, at the core, according to an embodiment of the present invention.

FIG. 5 is a perspective exploded view of a lamina 500 usable as a printed circuit board with selected flexure properties at one selected location, at the core 530, according to an embodiment of the present invention. Lamina 500 comprises a plurality first fiber-matrix layers 502 and a plurality of second fiber-matrix layers 504. The first fiber-matrix layer 502 comprises one or more fiber layers 520 impregnated with a high-temperature polymeric material 506. The fiber in fiber layers 520 are substantially consistently orientated throughout the fiber-matrix layer 502. In another embodiment, the fiber orientation of fiber layer 520 is substantially parallel to the edges of the first fiber-matrix layer 502. In another embodiment, the fiber orientation of fiber layer 520 is at an angle to the edges of the first fiber-matrix layer 502. In yet another embodiment of the present invention, second fiber layer 510 may have a random fiber orientation.

Second fiber-matrix layer 504 comprises one or more fiber layers 510, preferentially orientated fibers 512, impregnated with polymeric material 506. The fiber orientation of second fiber layer 510 is substantially parallel with the edges of the second fiber-matrix layer 504. Fiber layer 510 comprises transverse fibers 505 and longitudinal fibers 503, which may be woven, such as in a cloth. In another embodiment, the fiber orientation of second fiber layer 510 may be at an angle to the edges of the second fiber-matrix layer 504. In yet another embodiment of the present invention, second fiber layer 510 may have a random fiber orientation. Preferentially orientated fibers 512, in one embodiment, comprise the same material composition as fiber layer 510. In other embodiments, preferentially orientated fibers 512 comprise a different material composition as fiber layer 510.

Core 530 is the region of the second fiber-matrix layer 504 that will ultimately comprise the core 530 of the composite panel. In the core 530, the orientation of some or all of the fibers 512 are orientated in the direction transverse, or substantially normal, to the characteristic fold 532. As applied to the ATX form factor motherboard as shown in FIG. 1, for example, the orientation of some or substantially all of the fibers 512 are longitudinal, in other words parallel, to the long axis of the PCB 100, and thus, transverse to the characteristic fold 130.

The number of first fiber-matrix layers 502 and second fiber-matrix layers 504 are determined by the desired thickness of the lamina 500 as well as the desired reinforcement needed to minimize flexing along the characteristic fold 532 given the size and weight of the electrical components attached to the final PCB. Further, the number of laminae 500 having preferentially orientated second fiber-matrix layer 504 in a given PCB is also determined by the given size and weight of the electrical components attached to the PCB 500. In another embodiment, lamina 500 comprises only second fiber-matrix layers 504.

Figure 6:
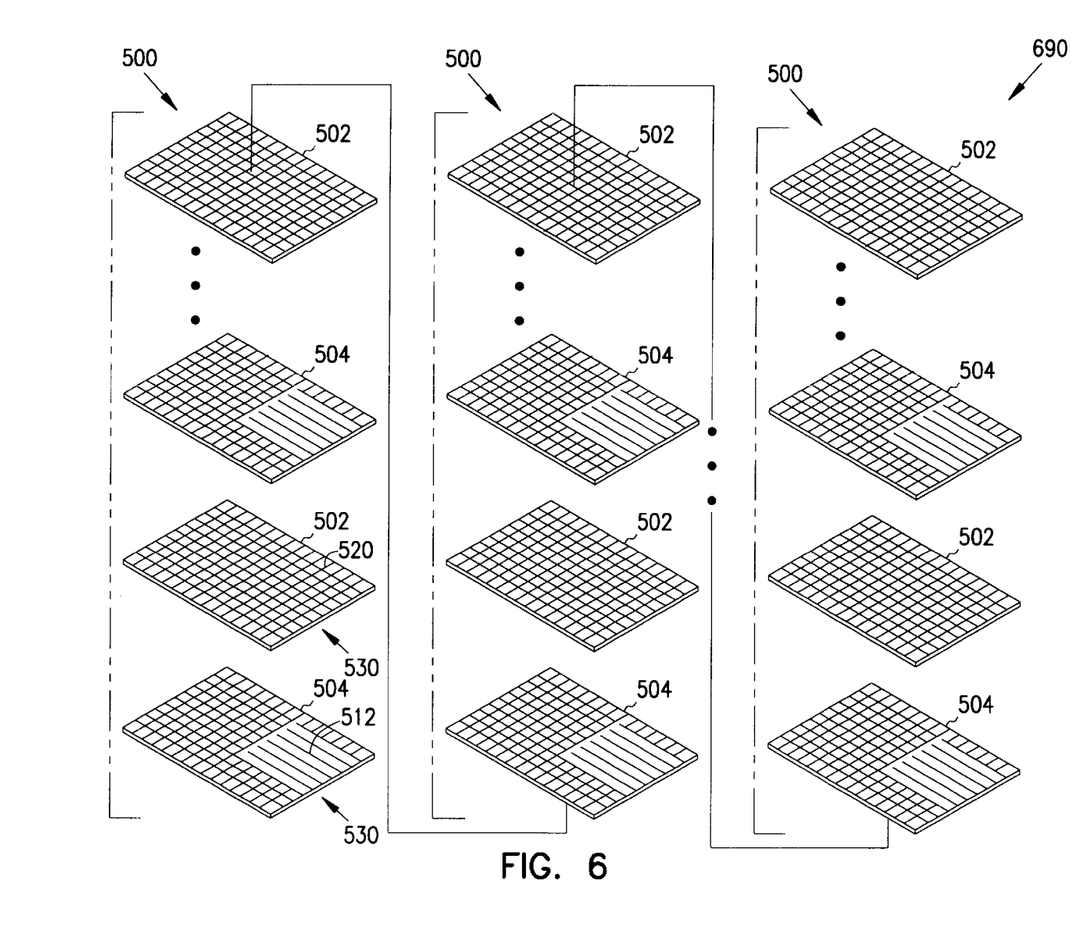
FIG. 6 is a perspective exploded view of a plurality of laminae usable as a printed circuit board with selected flexure properties at one selected location, according to an embodiment of the present invention.

FIG. 6 is a perspective exploded view of a plurality of laminae 500 usable as a printed circuit board with selected flexure properties at one selected location according to an embodiment of the present invention. In the embodiment of FIG. 6, laminae 500 of the composite panel 690 comprise one or more alternating layers of first fiber-matrix layers 502 and second fiber-matrix layers 504. First fiber-matrix layer 502 comprises fibers 520 that run both longitudinal and transverse to the long side of the fiber-matrix layer 504 throughout the fiber-matrix layer 520 including the core 530. The core 530 of the second fiber-matrix layer 504 comprises fibers 512 that run longitudinal to the long side of the fiber-matrix layer 504.

Figure 7:
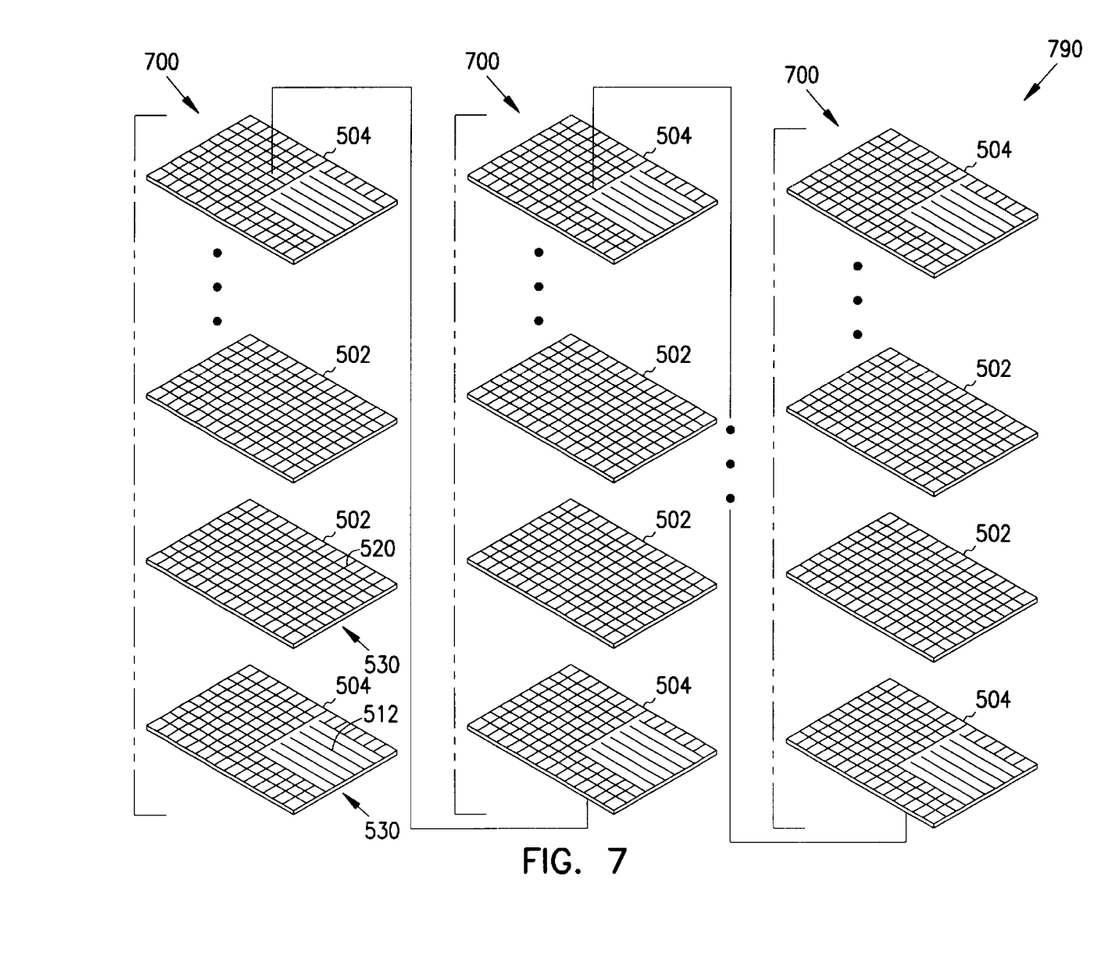
FIG. 7 is a perspective exploded view of a plurality of laminae usable as a printed circuit board with selected flexure properties at one selected location according to an embodiment of the present invention.

FIG. 7 is a perspective exploded view of a plurality of laminae 700 usable as a printed circuit board with selected flexure properties at one selected location according to an embodiment of the present invention. In the embodiment of FIG. 7, laminae 700 comprise a non-equal quantity of first fiber-matrix layers 502 and second fiber-matrix layers 504. The core 530 of second fiber-matrix layer 504 comprises fibers 512 that run longitudinal to the long side of the fiber-matrix layer 504. First fiber-matrix layer 502 comprises fibers 520 that run both longitudinal and transverse to the long side of the fiber-matrix layer 502 throughout the fiber-matrix layer 520 including the core 530.

Figure 8:
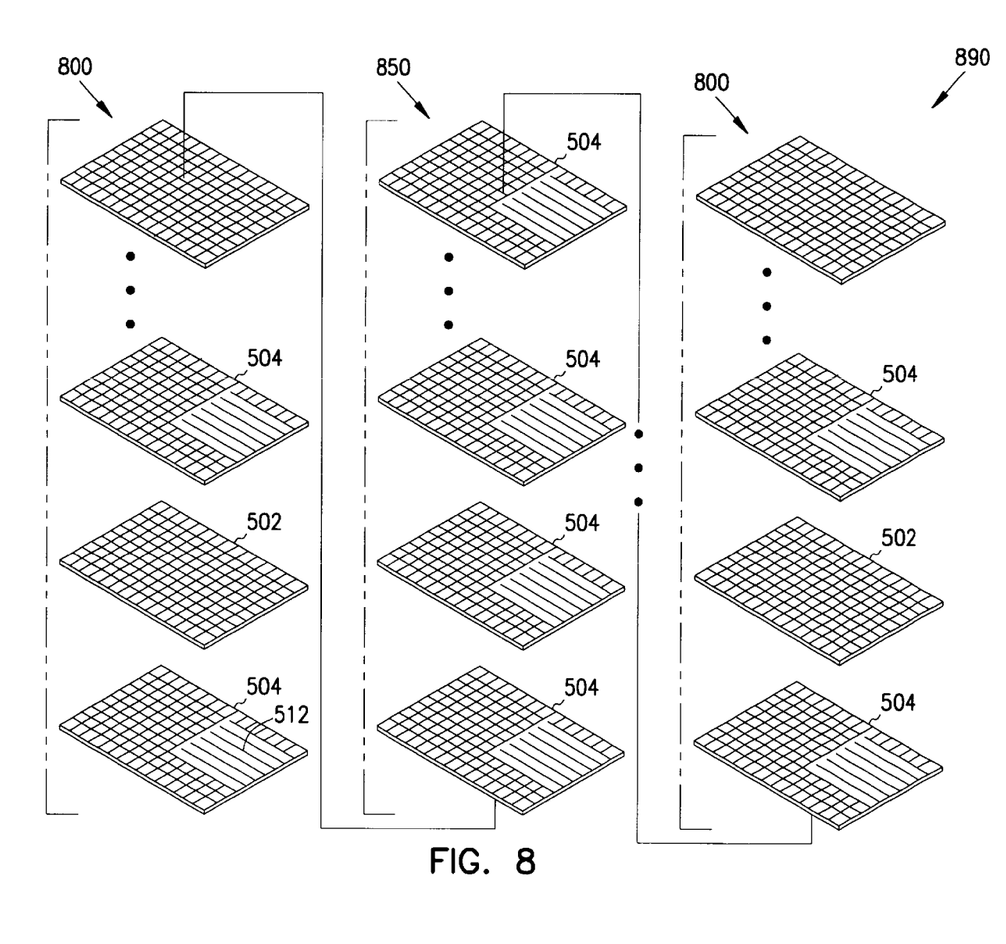
FIG. 8 is a perspective exploded view of one or more third laminae usable as a printed circuit board with selected flexure properties at one selected location according to an embodiment of the present invention.

FIG. 8 is a perspective exploded view of one or more third laminae 850 usable as a printed circuit board with selected flexure properties at one selected location according to an embodiment of the present invention. In the embodiment of FIG. 8, second laminae 800 comprise one or more alternating layers of first fiber-matrix layers 502 and second fiber-matrix layers 504. One or more third laminae 850 are comprised of one or more second fiber-matrix layers 504. In other embodiments, composite panel 890 is comprised of various alternating and non-alternating laminae 800 and 850 and fiber-matrix layers 502 and 504. In yet other embodiments, only third laminae 850 are used.

Figure 9:
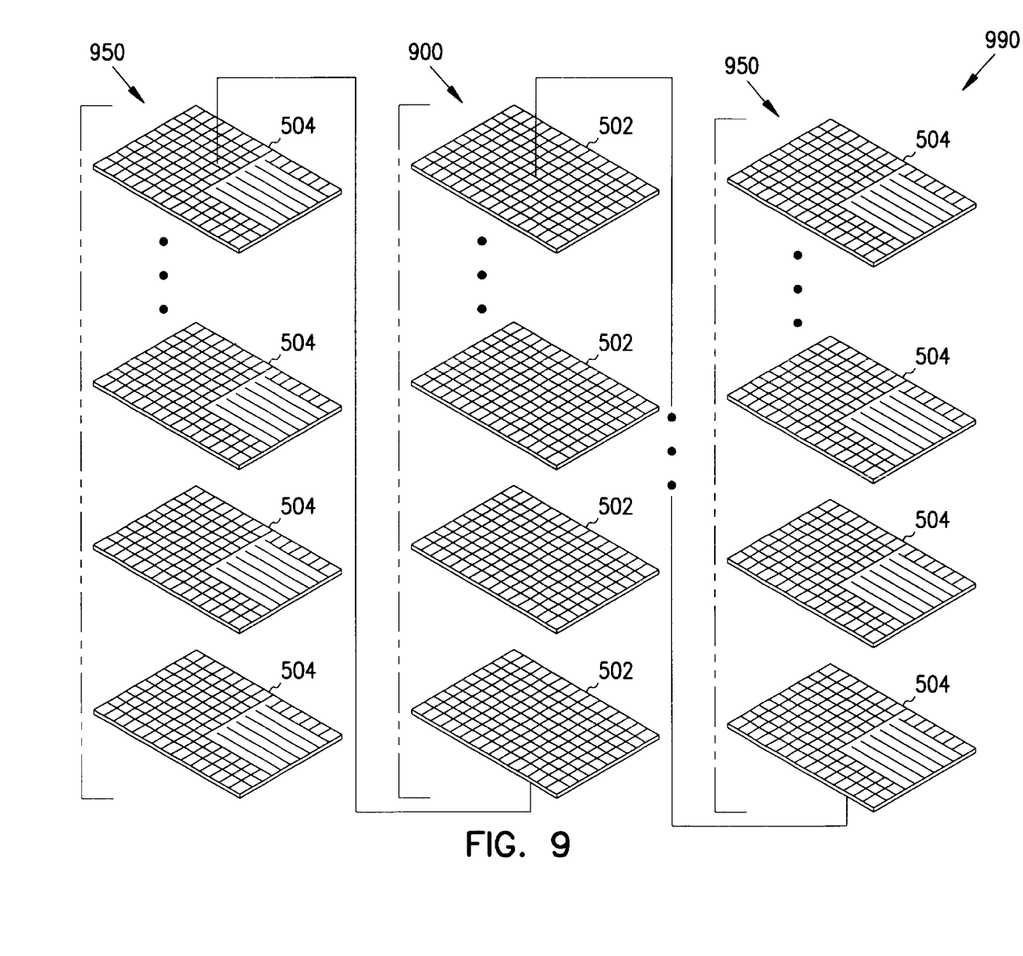
FIG. 9 is a perspective exploded view of one or more first laminae 900 and one or more second laminae usable as a printed circuit board with selected flexure properties at one selected location according to an embodiment of the present invention.

FIG. 9 is a perspective exploded view of one or more first laminae 900 and one or more second laminae 950 usable as a printed circuit board with selected flexure properties at one selected location according to an embodiment of the present invention. In the embodiment of FIG. 9, first laminae 900 comprise first fiber-matrix layers 502 and second laminae 950 comprise second fiber-matrix layers 504.

Other combinations of first and second fiber-matrix layers 502, 504 are within the scope of the present invention. Other fiber orientations of the first and second fiber-matrix layers 502, 504 are also within the scope of the present invention. Other combinations of laminae 900, 950 are also within the scope of the present invention. One or more fiber compositions are also within the scope of the present invention. The desired characteristics and properties of the composite panel are determined by the specific combinations of fiber-matrix layers 502, 504 and laminae 900, 950, as well as the composition or combination of compositions of the fibers.

A lamina formed from the layering of fiber-matrix layers in accordance with the embodiments of the present invention generally has a substantially uniform fiber/polymer density throughout the lamina. Similarly, a PCB formed from the layering of the above laminae in accordance with the embodiments of the present invention has a substantially uniform fiber/polymer density throughout the PCB.

Methods of making a composite panel usable as a printed circuit board with selective flexure properties at selected locations are discussed below. Preferentially orientating a portion of the circuit board fibers in the core area, such that additional fibers are transverse to the characteristic fold, for example, can be accomplished in a number of ways.

Referring first to FIG. 5, the second fiber-matrix layer 504 is modified in selected locations where a desirable flexure property is sought. In one embodiment of a method of the present invention, a desired flexure property is produced by orientating at least a portion of the fibers 503, 505 transverse to the characteristic fold 532. In the embodiment of FIG. 5, fiber layer 510 is formed with a substantially uniform fiber orientation. At least a portion of fibers 503 which are not transverse or substantially perpendicular to the characteristic fold 532 in the core 530, are removed from the core 530 and replaced with a substantially equal number of second fibers 505 which are orientated transverse or substantially perpendicular to the characteristic fold 532. The fiber layer 510 is subsequently impregnated with polymeric material 506 forming a second fiber-matrix layer 504. The fiber to polymer density remains substantially uniform throughout the fiber-matrix layer 504. That is, only fiber orientation has been changed in the selected location.

Figure 10:
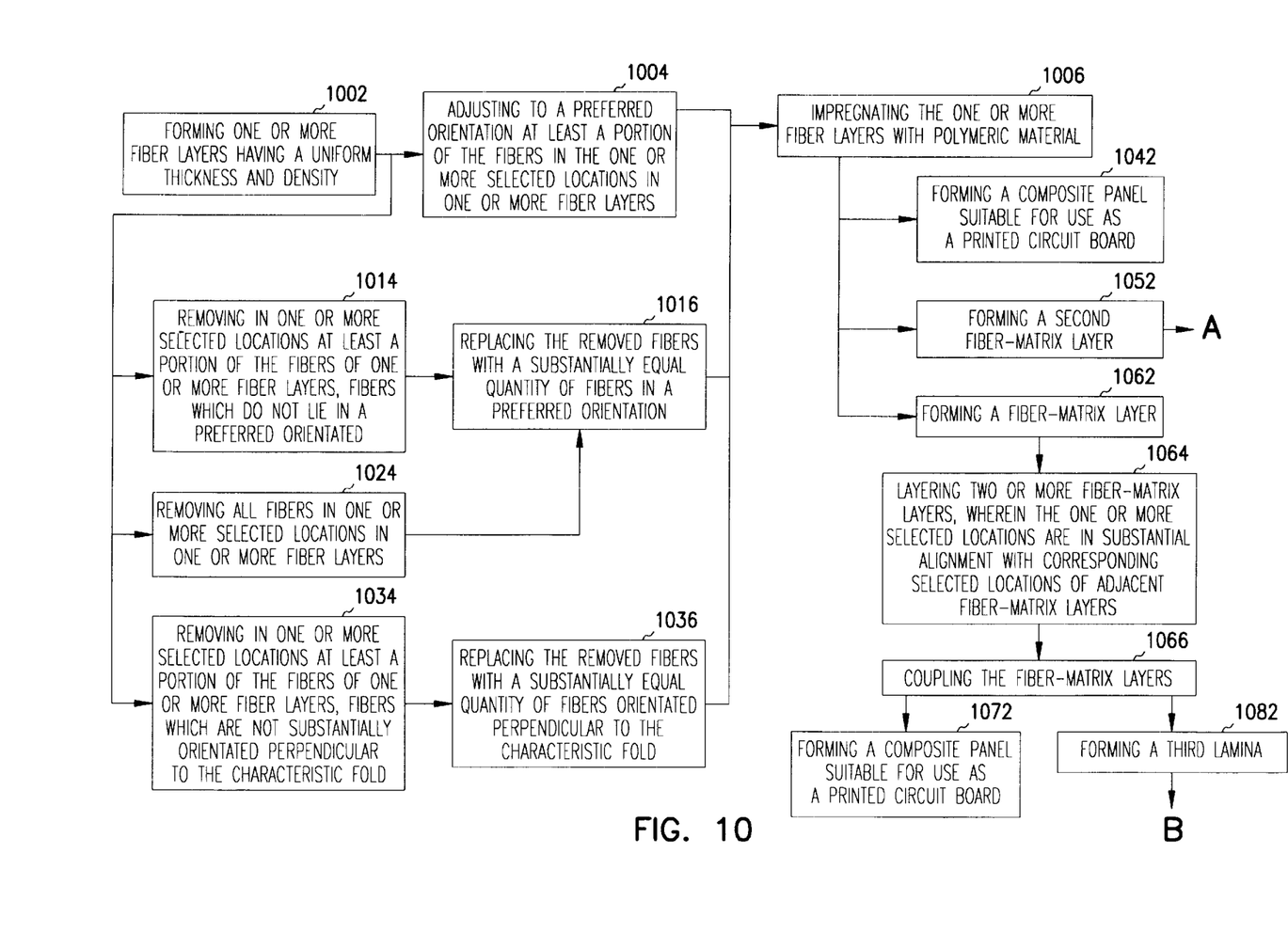
FIG. 10 is a block diagram of a number of methods for making a composite panel with selective flexure properties at selected locations suitable for use as a printed circuit board substrate according to eight embodiments of the present invention.

Referring now to FIG. 10, FIG. 10 is a block diagram of a number of methods for making a composite panel with selective flexure properties at selected locations suitable for use as a printed circuit board substrate according to eight embodiments of the present invention. One embodiment comprises forming one or more fiber layers 1002, adjusting to a preferred orientation at least a portion of the fibers in one or more selected locations in one or more fiber layers 1004, and impregnating the one or more fiber layers with polymeric material 1006, which forms a composite panel suitable for use as a printed circuit board 1042.

In another embodiment of the present invention, one or more fiber layers are formed 1002, at least a portion of fibers in one or more selected locations of one or more fiber layers which are not in a preferred orientation are removed 1014 and replaced by a substantially equal quantity of fibers in a preferred orientation 1016. After which, the one or more fiber layers are impregnated with polymeric material 1006 which forms a composite panel suitable for use as a printed circuit board 1042.

In yet another embodiment of the present invention, one or more fiber layers are formed 1002, all of the fibers in one or more selected locations of one or more fiber layers are removed 1024 and replaced by a substantially equal quantity of fibers in a preferred orientation 1016. After which, the one or more fiber layers are impregnated with polymeric material 1006 which forms a composite panel suitable for use as a printed circuit board 1042.

In a further embodiment of the present invention, one or more fiber layers are formed 1002, at least a portion of fibers in one or more selected locations of one or more fiber layers which are not transverse to the characteristic fold are removed 1034 and replaced by a substantially equal quantity of fibers in an orientation transverse to the characteristic fold 1036. After which, the one or more fiber layers are impregnated with polymeric material 1006 which forms a composite panel suitable for use as a printed circuit board 1042.

In other embodiments of the present invention discussed above, once the one or more fiber layers are impregnated with polymeric material 1006, the resulting fiber-matrix layer 1052, 1062 may be further processed as provided by "A", or layered with additional fiber-matrix layers wherein the one or more selected locations of one fiber-matrix layers are in substantial alignment with selected locations of adjacent layers 1064, and the fiber-matrix layers are then coupled to form a composite panel suitable for use as a printed circuit board 1072 or to form a third lamina 1082 for further processing as provided by "B".

Figure 11:
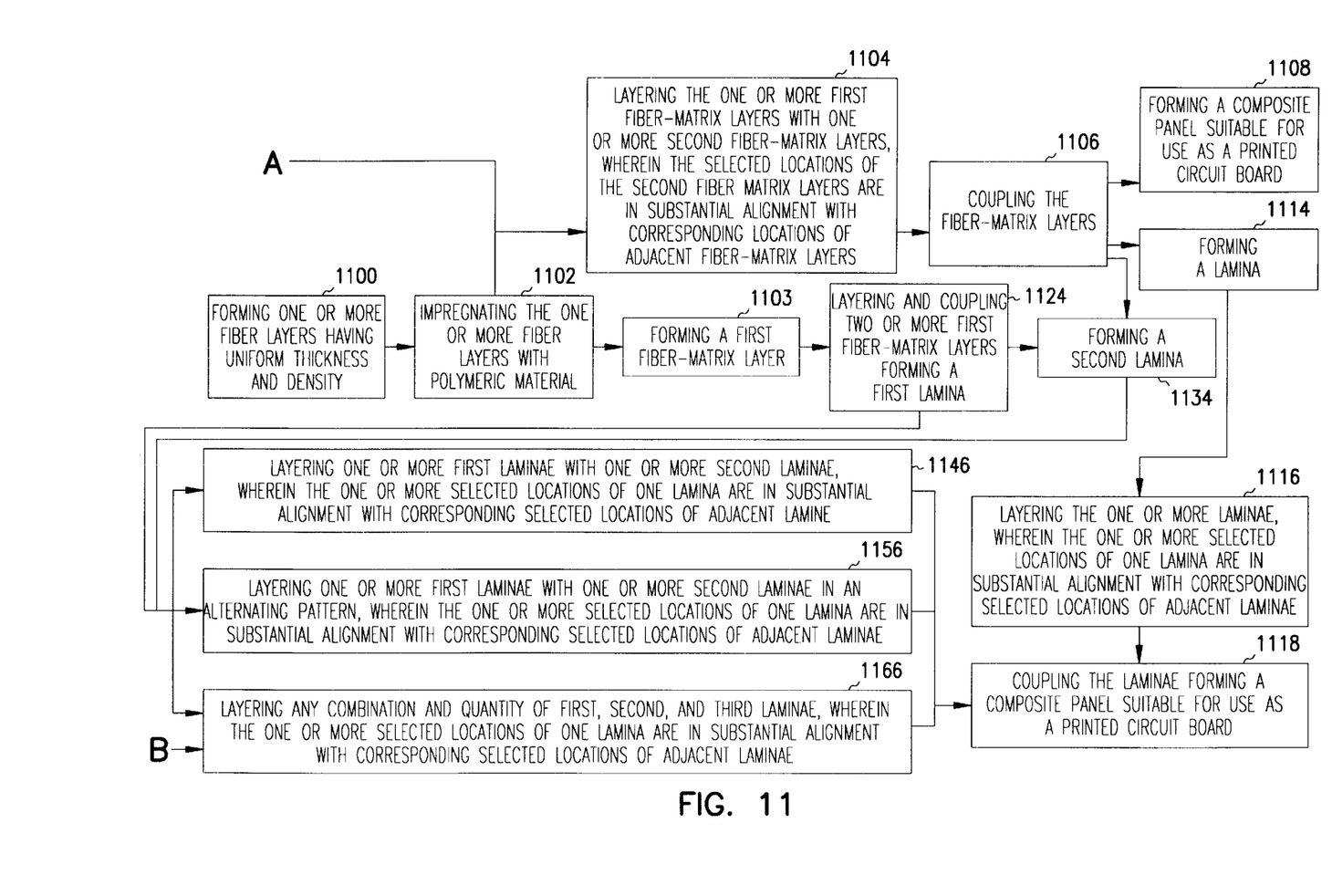
FIG. 11 is a block diagram of a number of methods for making a composite panel with selective flexure properties at selected locations suitable for use as a printed circuit board substrate according to twenty embodiments of the present invention.

FIG. 11 is a block diagram of a number of additional methods for making a composite panel with selective flexure properties at selected locations suitable for use as a printed circuit board substrate according to twenty embodiments of the present invention. A number of embodiments requires that one or more first fiber-matrix layers be formed 1103 comprising forming one or more fiber layers 1100 and impregnating the one or more fiber layers with polymeric material 1102. One embodiment layers the one or more first fiber-matrix layers provided by method 1102 with one or more second fiber-matrix layers provided by "A", method 1052 presented previously in FIG. 10, wherein the one or more selected locations of the second fiber-matrix layers are in substantial alignment with corresponding selected locations of adjacent laminae 1104. The layered fiber-matrix layers are coupled 1106 and formed into a composite panel suitable for use as a printed circuit board 1108.

In another embodiment of the present invention, the layered fiber-matrix layers are coupled 1106 and formed into a lamina 1114. Two or more laminae are subsequently layered wherein the one or more selected locations of the laminae are in substantial alignment with corresponding selected locations of adjacent laminae 1116, after which the laminae are coupled to form a composite panel suitable for use as a printed circuit board 1118.

In yet other embodiments of the present invention, two or more first fiber-matrix layers are layered and coupled forming a first lamina 1124. Thereafter, any combination and quantity of first and second lamina are layered 1146, 1156, and the laminae are coupled to form a composite panel suitable for use as a printed circuit board 1118.

In further embodiments of the present invention, third lamina provided by "B", method 1082 described previously in FIG. 10, are combined in any combination and quantity of first and second laminae 1166, which are coupled to form a composite panel suitable for use as a printed circuit board 1118.

In the above embodiments, it is understood that the coupling of layers can be effected by gluing, consolidation under heat and pressure, mechanical means, and other methods of consolidating circuit boards known in the art. It is also understood that conductive paths, printed circuits, magnetic shielding layers, conductive or insulative layers, and the like may be applied to either the fiber-matrix layer, the laminae, or the composite panel. It is further understood that conductive paths, printed circuits, magnetic shielding layers, and the like may be interlaid between the fiber-matrix layers or laminae without deviating from the scope of the present invention.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A printed circuit board comprising:
   a panel formed of a plurality of lamina, each lamina being formed from a plurality of fiber-matrix layers, at least one of the fiber-matrix layers in at least one of the lamina including fiber arranged in a first orientation to provide structural integrity and a section where the fibers are arranged in a second orientation that is different from the first orientation, wherein the section in the at least one fiber-matrix layer is a core; and
   electrical components mounted on the panel.

2. The printed circuit board of claim 1 wherein the electrical components are mounted on the panel according to an industry standardized PCB configuration.

3. The printed circuit board of claim 1 wherein the electrical components are mounted on the panel in the core.

4. The printed circuit board of claim 3 wherein the electrical components are mounted on the panel so as to form a fold in the core, the fiber in the section of the at least one fiber-matrix layer being oriented substantially transverse to the fold.

5. The printed circuit board of claim 1 wherein the fiber in the core is oriented in a single direction.

6. The printed circuit board of claim 1 wherein the core in the first fiber-matrix layer includes a fold.

7. The printed circuit board of claim 6 wherein the fiber in the core is oriented transverse to the fold.

8. The printed circuit board of claim 1 wherein each of the fiber-matrix layers is impregnated with a polymeric material.

9. The printed circuit board of claim 1 wherein each fiber-matrix layer in the at least one lamina includes fiber arranged in a first orientation to provide structural integrity and a section where the fibers are arranged in the second orientation that is different from the first orientation.

10. The printed circuit board of claim 9 wherein the sections in each of the fiber-matrix layers are aligned.

11. The printed circuit board of claim 1 wherein alternating fiber-matrix layers in the at least one lamina include fibers arranged in a first orientation to provide structural integrity and a section where the fibers are arranged in the second orientation that is different from the first orientation.

12. The printed circuit board of claim 11 wherein the sections in the alternating fiber-matrix layers are aligned.

* * * * *